(12) United States Patent
Kim (10) Patent No.: US 10,706,804 B2
(45) Date of Patent: Jul. 7, 2020

(54) SHIFT REGISTER, IMAGE DISPLAY INCLUDING THE SAME, AND METHOD OF DRIVING THE SAME

(71) Applicant: LG DISPLAY CO., LTD., Seoul (KR)

(72) Inventor: Taegi Kim, Gangneung-si (KR)

(73) Assignee: LG DISPLAY CO., LTD., Seoul (KR)

( * ) Notice: Subject to any disclaimer, the term of this patent is extended or adjusted under 35 U.S.C. 154(b) by 78 days.

(21) Appl. No.: 15/816,590

(22) Filed: Nov. 17, 2017

(65) Prior Publication Data

US 2018/0151143 A1 May 31, 2018

(30) Foreign Application Priority Data

Nov. 30, 2016 (KR) .................... 10-2016-0162262

(51) Int. Cl.
*G06F 3/041* (2006.01)
*G09G 3/36* (2006.01)
(Continued)

(52) U.S. Cl.
CPC ......... *G09G 3/3677* (2013.01); *G06F 3/0412* (2013.01); *G06F 3/0416* (2013.01); *G06F 3/0418* (2013.01); *G09G 3/3688* (2013.01); *G11C 19/28* (2013.01); *G02F 1/13338* (2013.01); *G09G 2310/0286* (2013.01); *G09G 2310/08* (2013.01); *G09G 2320/043* (2013.01)

(58) Field of Classification Search
CPC ...... G06F 3/0412; G06F 3/0416; G06F 3/044; G06F 3/0418
See application file for complete search history.

(56) References Cited

U.S. PATENT DOCUMENTS

| | | | | |
|---|---|---|---|---|
| 2008/0246739 A1* | 10/2008 | Choi | ............... | G02F 1/167 345/173 |
| 2015/0316976 A1* | 11/2015 | Toyotaka | ............... | G06F 1/1641 361/679.27 |
| 2017/0115808 A1* | 4/2017 | Cho | ............... | G06F 3/0412 |

FOREIGN PATENT DOCUMENTS

KR   10-2016-0083791 A   7/2016

\* cited by examiner

*Primary Examiner* — Kent W Chang
*Assistant Examiner* — Scott Au
(74) *Attorney, Agent, or Firm* — Birch, Stewart, Kolasch & Birch, LLP

(57) ABSTRACT

A shift register provided to an in-cell touch panel, an image display including the same, and a method of driving the same. The shift register has a plurality of stages dependently connected to one another and includes first to $n^{th}$ stages dependently connected to one another in each of a plurality of block regions divided according to an image display period and a touch sensing period alternating plural times during each frame period; and first and second bridge stages disposed between each pair of adjacent block regions. According to the present invention, the shift register includes a plurality of bridge stages between each adjacent pair of adjacent stages among a plurality of stages divided according to an image display period and a touch sensing period to allow the plurality of stages to be driven in association with one another even during the touch sensing period, thereby preventing deterioration of specific stages. The shift register can prevent an abnormal screen such as a horizontal line defect in an image display panel, reduce a defect rate, and enhance customer satisfaction, thereby improving reliability of a product.

12 Claims, 8 Drawing Sheets

(51) Int. Cl.
*G11C 19/28* (2006.01)
*G02F 1/1333* (2006.01)

SHIFT REGISTER, IMAGE DISPLAY INCLUDING THE SAME, AND METHOD OF DRIVING THE SAME

CROSS-REFERENCE TO RELATED APPLICATIONS

This application claims the priority of Korean Patent Application No. 10-2016-0162262 filed on Nov. 30, 2016, in the Korean Intellectual Property Office, the disclosure of which is hereby incorporated by reference in its entirety into the present application.

BACKGROUND

1. Technical Field

The present invention relates to a shift register, and, more particularly, to a shift register provided to an in-cell touch panel, an image display including the same, and a method of driving the same.

2. Description of the Related Art

Recently, a touch-type display is widely used in mobile devices and the like. In such a touch-type display, a certain object or region on a screen is selected by touching the region with a finger or a stylus.

A touch panel for sensing a touch is mainly used in flat panel displays such as liquid crystal displays and organic light emitting diode displays.

A liquid crystal display including a touch panel may be divided into an on-cell type liquid crystal display, in which the touch panel is attached to an upper surface of a liquid crystal panel, and an in-cell type liquid crystal display, in which two electrodes of the touch panel are formed on a TFT substrate constituting a liquid crystal panel.

In addition to a plurality of touch electrodes, an in-cell type liquid crystal display panel includes a plurality of gate lines and data lines arranged to cross one another and pixel regions defined by the gate lines and the data lines crossing at right angles. Further, the liquid crystal panel includes pixel electrodes and a common electrode to apply an electric field to each of the pixel regions.

A driver circuit for driving the in-cell type liquid crystal display panel includes a gate driver for driving the gate lines, a data driver for driving the data lines, and a timing controller that supplies a control signal for controlling the gate driver and the data driver. The gate driver sequentially supplies scan pulses to the gate lines such that liquid crystal cells of the liquid crystal panel can be sequentially driven one line by one line. Thus, the gate driver includes a shift register to sequentially output the scan pulses. The shift register is composed of a plurality of stages outputting the scan pulses, each supplying the scan pulse to a corresponding gate line in one-to-one correspondence. Here, the data driver supplies a pixel voltage signal to each of the data lines every time the scan pulse is supplied to one of the gate lines.

For the in-cell type liquid crystal display panel, each frame period is time-divided into a plurality of image display periods and a plurality of touch sensing periods for alternate driving. Specifically, the scan pulses are sequentially supplied to the gate lines for a predetermined period of time during each frame period, and then supply of the scan pulses is stopped and a touch is sensed in the touch sensing period. Then, after the scan pulses are output again, output of the scan pulses is stopped and an operation of sensing a touch is performed. This process is repeated multiple times in each frame period.

Certain stages of the shift register are kept in an enabled state every touch sensing period during each frame period and thus inevitably suffer from deterioration. Particularly, since only the same stages are repeatedly kept in an enabled state for each certain period of time, the repeated deterioration of the stages causes a horizontal line defect or the like in a corresponding horizontal line. Such a horizontal line defect or an abnormal screen can lead to a display failure, thereby causing deterioration in product reliability.

BRIEF SUMMARY

The present invention has been conceived to solve or address such problems in the related art and is aimed at providing, for example, a shift register which includes a plurality of bridge stages disposed between each adjacent pair of adjacent stages among a plurality of stages divided according to an image display period and a touch sensing period to allow the plurality of stages to be driven in association with one another even during the touch sensing period, thereby preventing deterioration of specific stages. In addition, the present invention is aimed at providing a display including the shift register and a method of driving the shift register.

Specifically, it is one aspect of the present invention to provide a shift register which includes a plurality of block regions divided according to an image display period and a touch sensing period and including stages respectively corresponding to a plurality of gate lines; and first and second bridge stages disposed between each pair of adjacent block regions. In the shift register, the last stage of each block region supplies a carry pulse to the first bridge stage to be disabled. Then, the first stage of each block region is enabled by a carry pulse from the second bridge stage such that the stages of the shift register can be sequentially driven in association with one another.

It is another aspect of the present invention to provide a display including the shift register as set forth above and a method of driving the same.

In accordance with one aspect of the present invention, a shift register has a plurality of stages dependently connected to one another and includes first to nth stages dependently connected to one another in each of a plurality of block regions divided according to an image display period and a touch sensing period alternating plural times during each frame period, where n is a positive integer equal to or greater than 2; and first and second bridge stages disposed between each pair of adjacent block regions.

In accordance with another aspect of the present invention, an image display includes an image display panel having an image display area to display an image; a gate driver driving a plurality of gate lines arranged in parallel in the image display area; a plurality of data drivers driving a plurality of data lines; and a timing controller controlling driving timings of the gate driver and the data drivers, wherein the gate driver includes the shift register as set forth above in order to sequentially supply a plurality of scan pulses to the plurality of gate lines corresponding to a plurality of block regions divided according to an image display period and a touch sensing period alternating plural times during each frame period.

In accordance with a further aspect of the present invention, a method of driving a shift register having a plurality of stages dependently connected to one another includes sequentially driving first to nth stages dependently connected to one another in each of block regions divided according to an image display period and a touch sensing period alternating plural times during each frame period; driving a first bridge stage disposed between each pair of adjacent block regions; and driving a second bridge stage disposed between each pair of adjacent block regions.

A shift register according to embodiments of the present invention, an image display including the same, and a method of driving the same can achieve the following effects.

According to embodiments of the present invention, the shift register includes a plurality of bridge stages between each adjacent pair of adjacent stages among a plurality of stages divided according to an image display period and a touch sensing period to allow the plurality of stages to be driven in association with one another even during the touch sensing period, thereby preventing deterioration of specific stages.

Accordingly, the shift register according to the embodiments of the present invention can prevent an abnormal screen such as a horizontal line defect in an image display panel, reduce a defect rate, and enhance customer satisfaction, thereby improving product reliability.

BRIEF DESCRIPTION OF THE DRAWINGS

The above and other aspects, features, and advantages of the present invention will become apparent from the detailed description of the following embodiments in conjunction with the accompanying drawings, in which.

DETAILED DESCRIPTION

The above and other aspects, features, and advantages of the present invention will become apparent from the detailed description of the following embodiments in conjunction with the accompanying drawings. It should be understood that the present invention is not limited to the following embodiments and may be embodied in different ways, and that the embodiments are provided for complete disclosure and a thorough understanding of the present invention by those skilled in the art. Descriptions of known functions and constructions which may unnecessarily obscure the subject matter of the present invention will be omitted. Hereinafter, embodiments of the present invention will be described in detail with reference to the accompanying drawings.

Figure 1:
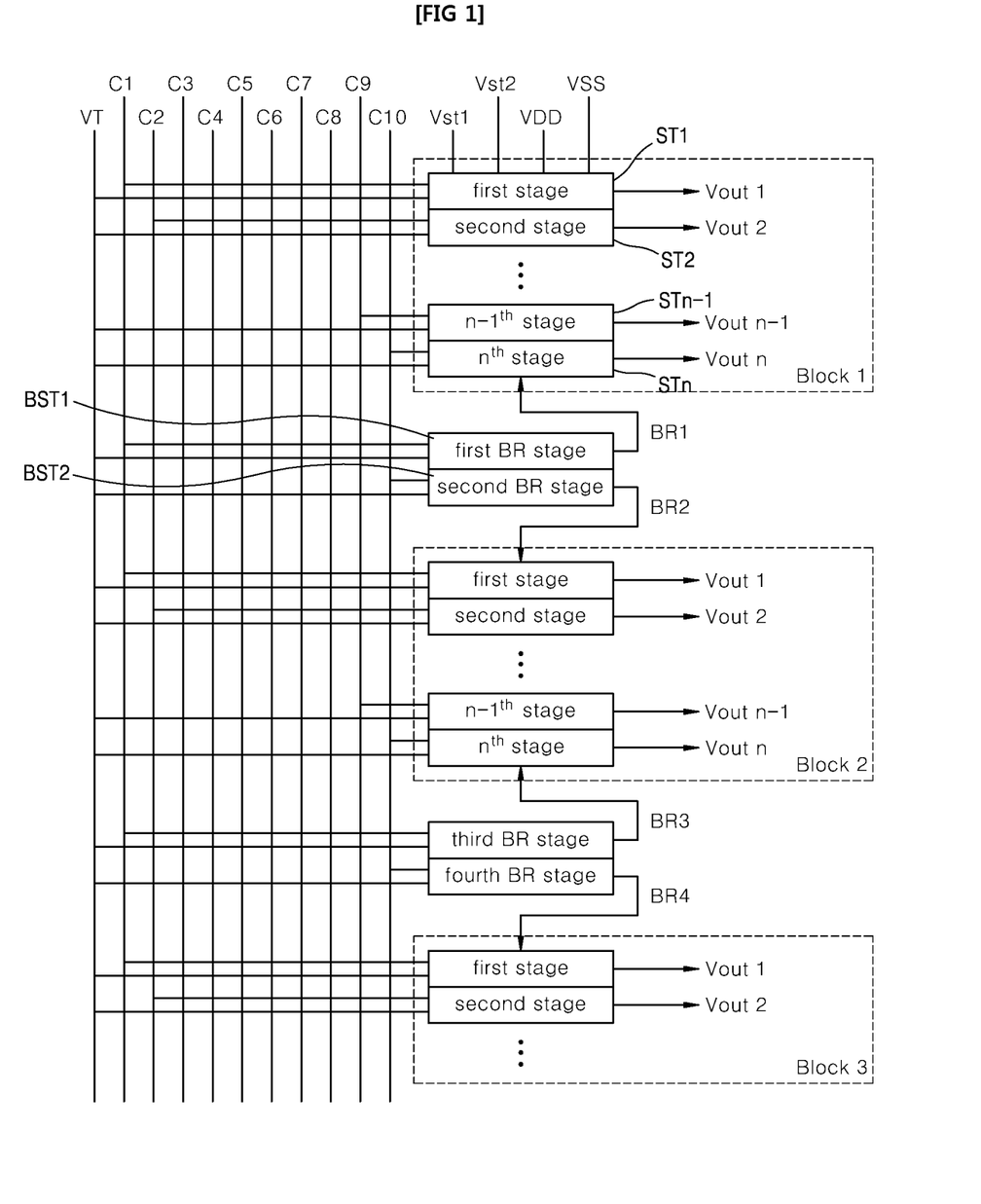
FIG. 1 is a block diagram of a shift register according to one embodiment of the present invention.

FIG. 1 is a block diagram of a shift register according to one embodiment of the present invention. The shift register is preferably provided to an in-cell touch panel included in an image display device; however, the shift register can be provided in other types of touch panels or display devices. All the components of the shift registers, the touch panels and the image display devices according to all embodiments of the present invention are operatively coupled and configured.

Referring to FIG. 1, a shift register according to one embodiment of the present invention includes n stages ST1 to STn dependently connected to one another in each of a plurality of block regions divided according to an image display period and a touch sensing period; and first and second bridge stages BST1, BST2 disposed between each pair of adjacent block regions. Here, n is equal to or great than 2. Preferably, n is a positive integer equal to or greater than 2.

Specifically, during the video display period in each frame period, first to nth stages ST1 to STn in a first block region sequentially output one carry pulse and one scan pulse Vout1 to Voutn. Each of the stages outputs the carry pulse and the scan pulse at the same time.

In other words, a first stage ST1 in the first block region simultaneously outputs the carry pulse and a first scan pulse Vout1, and then a second stage ST2 outputs the carry pulse and a second scan pulse Vout2. Then, a third stage ST3 outputs the carry pulse and a third scan pulse Vout3 . . . , and, finally, an nth stage STn outputs an nth scan pulse Voutn.

A first image display period continues until the nth scan pulse is output from the nth stage STn corresponding to the last stage, in the first block region, and the touch sensing period starts immediately after the first image display period.

During the touch sensing period, the first bridge stage BST1 next to the first block region receives the nth carry pulse from the nth stage STn and outputs a first bridge pulse BR1. Here, the first bridge pulse BR1 is supplied to the nth stage STn to force the nth stage to be disabled.

During the touch sensing period, a touch sensing signal is applied to touch electrodes of an image display unit of an image display panel to detect the presence of touch.

Thereafter, when the image display period starts again, the second bridge stage BST1 supplies a second bridge pulse BR2 to a first stage ST1 in a next block region. Thereupon, the first stage ST1 in the next block region simultaneously outputs a carry pulse and a first scan pulse Vout1, and then a second stage ST2 outputs a carry pulse and a second scan pulse Vout2. Then, a third stage ST3 outputs a carry pulse and a third scan pulse Vout3 . . . , and, finally, an nth stage STn corresponding to the last stage in that block region outputs an nth scan pulse Voutn.

When the image display period ends and the touch sensing period starts again, a first bridge stage BST1 next to the block region receives the nth carry pulse from the nth stage STn and outputs a first bridge pulse BR1. Here, the first bridge pulse BR1 is supplied to the nth stage STn to force the nth stage to be disabled.

In this manner, the image display period and the touch sensing period are alternated plural times during each frame period, and the first to nth stages ST1 to STn in each block region are sequentially operated. Since the first and second bridge stages BST1, BST2 are disposed between each pair of adjacent block regions, the first to nth stages ST1 to STn are all enabled to output the scan pulses during the same period, such that the nth stage corresponding to the last stage can be prevented from deteriorating.

Figure 2:
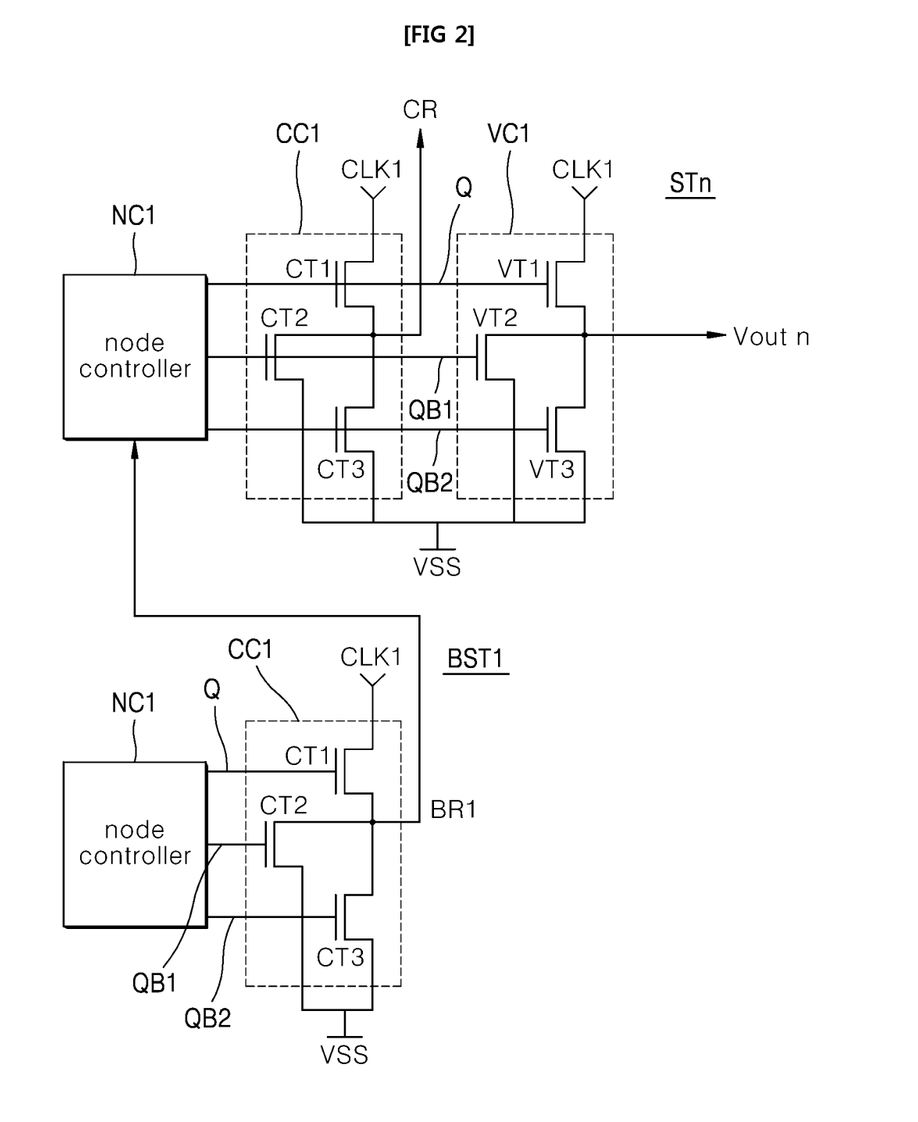
FIG. 2 is a block diagram of a first bridge stage and an nth stage in one of the block regions of FIG. 1.

FIG. 2 is a block diagram of a first bridge stage and an nth stage in one of the block regions of FIG. 1.

Since the stages ST1 to STn of FIG. 1 have the same configuration, the nth stage STn will be described by way of example. In addition, since the first and second bridge stages BST1, BST2 have the same configuration, the first bridge stage BST1 will be described by way of example.

Referring to FIG. 2, the nth stage includes a node controller NC1; a carry output unit CC1 connected to a set node Q and first and second reset nodes QB1, QB2 of the node controller NC1; and a scan pulse output unit VC1 connected to the set node Q and the first and second reset nodes QB1, QB2.

The carry output unit CC1 may supply carry signals CR to a predetermined one of the preceding stages and a predetermined one of the subsequent stages (for example, an n–3rd stage and an n+3rd stage), respectively. Here, the carry output unit CC1 may have the same configuration as the scan pulse output unit VC1.

The node controller NC1 controls logic states (Enable or Disable) of the set node Q and the first and second reset nodes QB1, QB2.

The scan pulse output unit VC1 includes a first pull-up switching device VT1, a first pull-down switching device VT2, and a second pull-down switching device VT3. When the set node Q is in a high logic state, the first pull-up switching device VT1 is turned on to output an nth clock pulse as an nth scan pulse Voutn. When each of the first and second reset nodes QB1, QB2 is in a high logic state, each of the first and second pull-down switching devices VT2, VT3 is turned on to output a low potential voltage source VSS as a gate low voltage.

The carry output unit CC1 may also include a first pull-up switching device CT1, a first pull-down switching device CT2, and a second pull-down switching device CT3 to output a carry pulse CR. The first pull-up switching device CT1, the first pull-down switching device CT2, and the second pull-down switching device CT3 are operated in the same manner as the first pull-up switching device VT1, the first pull-down switching device VT2, and the second pull-down switching device VT3 of the scan pulse output unit VC1, respectively.

As described above, the node controller NC1 controls the logic states of the set node Q and the first and second reset nodes QB1, QB2. Specifically, in response to first and second start pulses or a scan pulse from one of the preceding stages (for example, an n–3th stage), the node controller NC1 puts the set node Q into a high logic set state while putting the first and second reset nodes QB1, QB2 into a low logic reset state.

When the set node Q is in a high logic state, the scan pulse output unit VC1 outputs an nth clock pulse as an nth scan pulse Voutn and supplies the nth scan pulse to an nth gate line. Similarly, the carry output unit CC1 supplies a carry pulse to one of the preceding stages.

The first bridge stage BST1 includes a node controller NC1 and a carry output unit CC1 connected to a set node Q and first and second reset nodes QB1, QB2 of the node controller NC1.

The node controller NC1 of the first bridge stage BST1 controls the logic states (Enable or Disable) of the set node Q and the first and second reset nodes QB1, QB2.

In response to one clock pulse and a carry pulse from one of the preceding stages (for example, an n–3th stage or a previous stage), the node controller NC1 of the first bridge stage BST1 puts the set node Q into a high logic set state while putting the first and second reset nodes QB1, QB2 into a low logic reset state.

When the set node Q is in a high logic state according to a carry pulse from an n–3th stage or a previous stage, the carry output unit CC1 outputs an n+1th clock pulse as a first bridge pulse BR1 and supplies the first bridge pulse BR1 to the nth stage STn preceding the first bridge stage. Here, the n+1th clock pulse may be a 5th clock pulse C5 or a 6th clock pulse C6.

After outputting the nth scan pulse Voutn, the nth stage STn receives the first bridge pulse BR1 as a disable signal from the first bridge stage BST1 and puts the set node Q into a low logic reset state to be kept in a disabled state.

Figure 3:
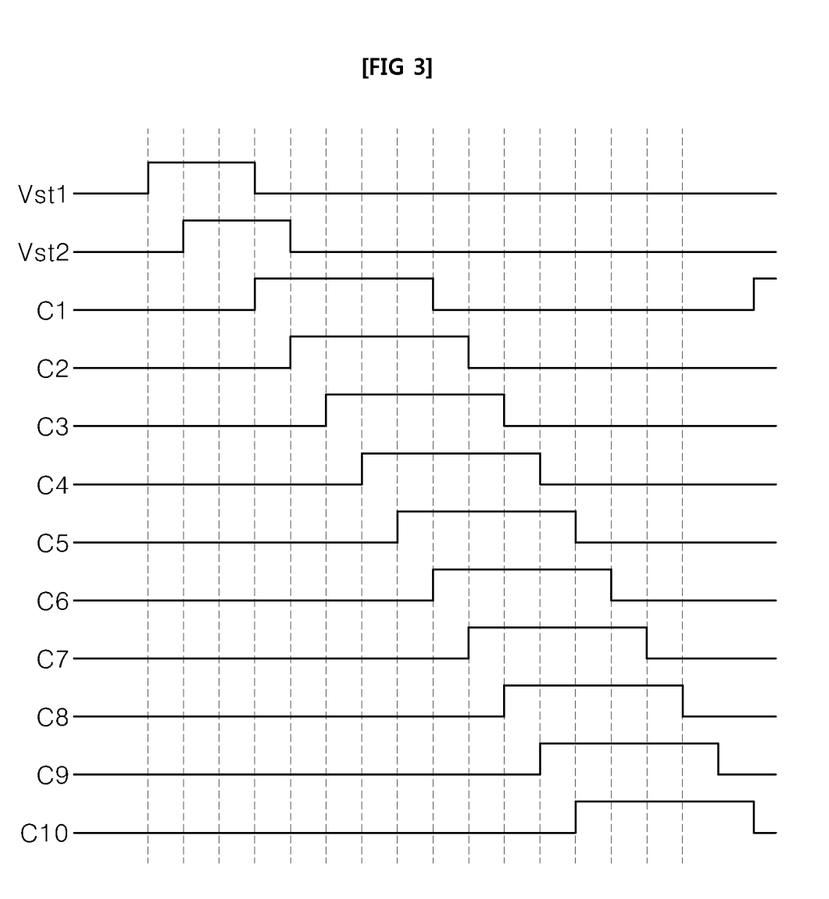
FIG. 3 is a timing chart showing an example of a waveform of a signal supplied to each of the stages of FIG. 1.

FIG. 3 is a timing chart showing a waveform of a signal supplied to each of the stages of FIG. 1.

Referring to FIG. 3, a plurality of clock pulses having different phase differences, for example, 1st to 10th clock pulses C1 to C10, are supplied to the first to nth stages ST1 to STn of each block region and the first and second bridge stages BST1, BST2.

The 1st to 10th clock pulses C1 to C10 are supplied to the shift resister in rotation such that pairs of adjacent clock pulses are generated to be kept active (i.e., in a high state) at the same time for a predetermined period of time.

Specifically, the 1st to 10th clock pulses C1 to C10 have the same pulse width and the same duty ratio and each of the 1st to 10th clock pulses is supplied to be kept active (i.e., in a high state) for 5 horizontal periods (5H). In addition, the pairs of adjacent clock pulses are supplied to overlap for 4 horizontal periods (4H).

For example, a second clock pulse C2 is generated to be phase-delayed by ⅕ the pulse width of a first clock pulse C1; a third clock pulse C3 is generated to be phase-delayed by ⅕ the pulse width of the second clock pulse C2; and a fourth clock pulse C4 is generated to be phase-delayed by ⅕ the pulse width of the third clock pulse C3. Accordingly, a pair of adjacent clock pulses is kept in a high state at the same time for a predetermined period of time (for example, for 4H periods). In other words, adjacent clock pulses in each pair overlap each other for a period of time corresponding to ⅘ the pulse width.

In addition, the first to nth stages ST1 to STn in each block region and the first and second bridge stages BST1, BST2 further receive a high potential voltage source VDD at at least one predetermined level and a low potential voltage source VSS at a different level.

Figure 4:
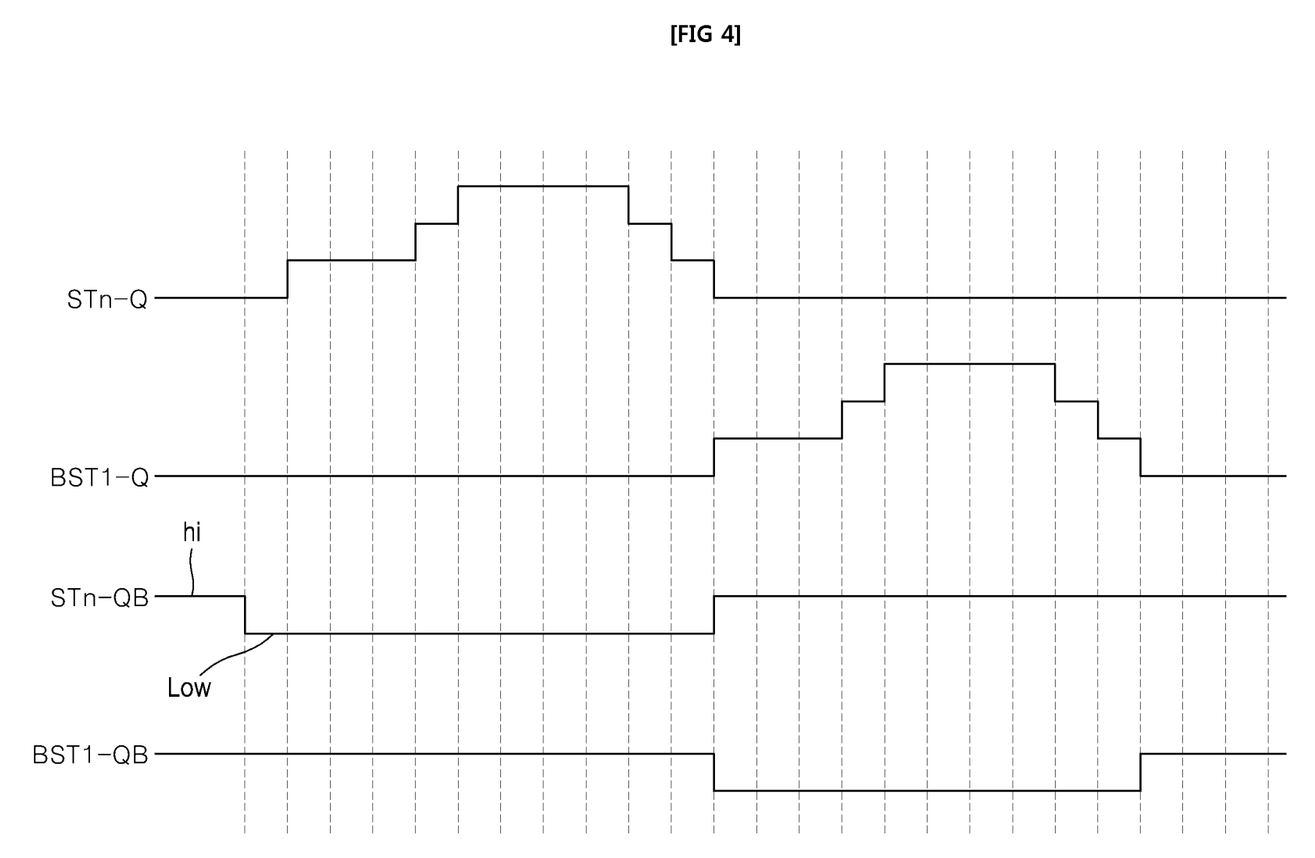
FIG. 4 is a timing chart showing an example of a waveform of set node voltage of the nth stage and the first bridge stage of FIG. 2.

FIG. 4 is a timing chart showing a waveform of set node voltage of the nth stage and the first bridge stage of FIG. 2.

Referring to FIGS. 2, 3, and 4, when the 1st to 10th clock pulses C1 to C10 are supplied to the first to nth stages ST1 to STn and the first and second bridge stages BST1, BST2, the nth stage STn is operated as follows:

First, upon application of a 9th clock pulse C9 corresponding to an n–1th clock pulse, the set node Q of the nth stage STn is put into a high logic state, and then the reset node QB is put into a low logic state. As a result, the first and second pull-up switching devices VT1, TR1, gate terminals of which are connected to the set node Q, are both turned on. Then, a 10th clock pulse C10 corresponding to an nth clock pulse is input to the nth stage and then is output as an nth scan pulse Vout1 through the turned-on first pull-up switching device VT1. When the 10th pulse C10 is supplied to a source terminal of the first pull-up switching device VT1, the voltage of a gate terminal of the first pull-up switching device VT1 rises due to a coupling phenomenon between the source terminal and the gate terminal (i.e., primary bootstrapping occurs). That is, as the 10th clock pulse C10 rises to a high logic level, the voltage of the gate terminal also rises in synchronism therewith. Since the gate terminal is connected to the set node Q, bootstrapping occurs, that is, the voltage of the set node Q also rises.

When the 10th clock pulse C10 is switched to a low logic level after 4 horizontal periods (4H), the voltage of the set node Q falls in synchronism with the low logic level of the 10th clock pulse C10.

In response to a carry pulse from an n−3rd stage or a previous stage, the first bridge stage BST1 puts the set node Q into a high logic set state while putting the first and second reset nodes QB1, QB2 into a low logic reset state. When the set node Q is put into a high logic state by the carry pulse from the n−3th stage or the previous stage, the carry output unit CC1 outputs a 5th clock pulse C5 or a 6th clock pulse as the first bridge pulse BR1 and supplies the first bridge pulse BR1 to the nth stage preceding the first bridge stage.

After outputting the nth scan pulse Voutn, the nth stage STn receives the first bridge pulse BR1 as a disable signal from the first bridge stage BST1 and puts the set node Q into a low logic reset state to be kept in a disabled state.

Specifically, the nth stage STn is disabled by the first bridge pulse BR1 after outputting the nth scan pulse Voutn. Here, the set node Q of the nth stage STn is switched to a low logic level by the first bridge pulse BR1 from the first bridge stage BST1, which is input subsequent to output of the nth scan pulse Voutn. The first and second reset nodes QB1, QB2 are set to a high logic state by a 7th clock pulse C7 or an 8th clock pulse C8 opposite in phase to the 10th clock pulse C10. As a result, the voltage of the nth gate line in each block region is maintained at a low level.

Figure 5:
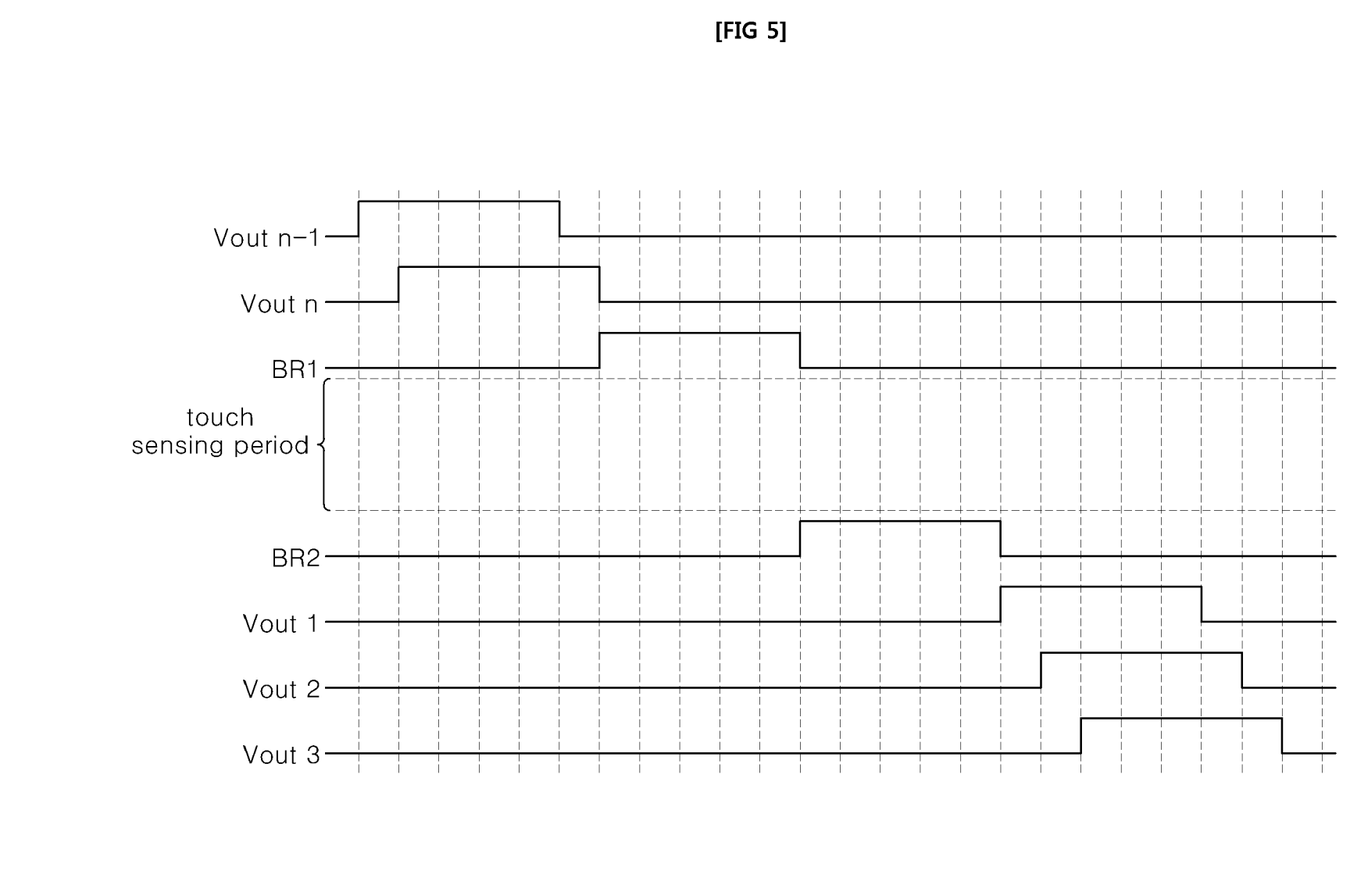
FIG. 5 is a timing chart of an example of a scan pulse output, showing how scan pulses output from the stages in each block region of FIGS. 1 and 2 are associated with one another.

FIG. 5 is a timing chart of scan pulse output, showing how scan pulses output from the stages in each block region of FIGS. 1 and 2 are associated with one another.

Referring to FIG. 5, an image display period continues until the nth stage corresponding to the last stage in one block region outputs the nth scan pulse Voutn. Then, a touch sensing period starts.

During the touch sensing period, the first bridge stage BST1 next to the block region outputs an n+1th clock pulse as the first bridge pulse BR1 and supplies the first bridge pulse to the nth stage preceding the first bridge stage. Here, the n+1th clock pulse may be a 5th clock pulse C5 or a 6th clock pulse C6. The first bridge pulse BR1 is supplied to the nth stage STn to force the nth stage STn to be disabled.

During the touch sensing period, a touch sensing signal is applied to touch electrodes of an image display unit of an image display panel to detect the presence of touch.

Thereafter, when the image display period starts again, the first and second start pulses Vst1, Vst2 and the 1st to 10th clock pulses C1 to C10 are sequentially supplied. At this time, the second bridge stage BST2 is enabled to supply the second bridge pulse BR2 to a first stage ST1 in a next block region.

The second bridge stage BST2 receives the first bridge pulse BR1 from the first bridge stage BST1 to be enabled. In addition, the second bridge stage BST2 may receive the n+1th clock pulse, for example, the 1st clock pulse C1 or the 6th clock pulse C2 and output the n+1th clock pulse as the second bridge pulse BR2. The second bridge pulse BR2 is supplied to the first stage in the next block region to force the first stage in the next block region to be enabled.

Thereupon, the first stage ST1 in the next block region simultaneously outputs the carry pulse and the first scan pulse Vout1, and then a second stage ST2 outputs the carry pulse and the second scan pulse Vout2 . . . , and, finally, an nth stage is operated.

As such, all the stages, from the first stage in a first block region to an nth stage STn in the last block region, are sequentially operated in association with one another.

The nth stage STn in the last block region receives the first bridge pulse BR1 from the last first bridge stage BST1 to be disabled.

Figure 6:
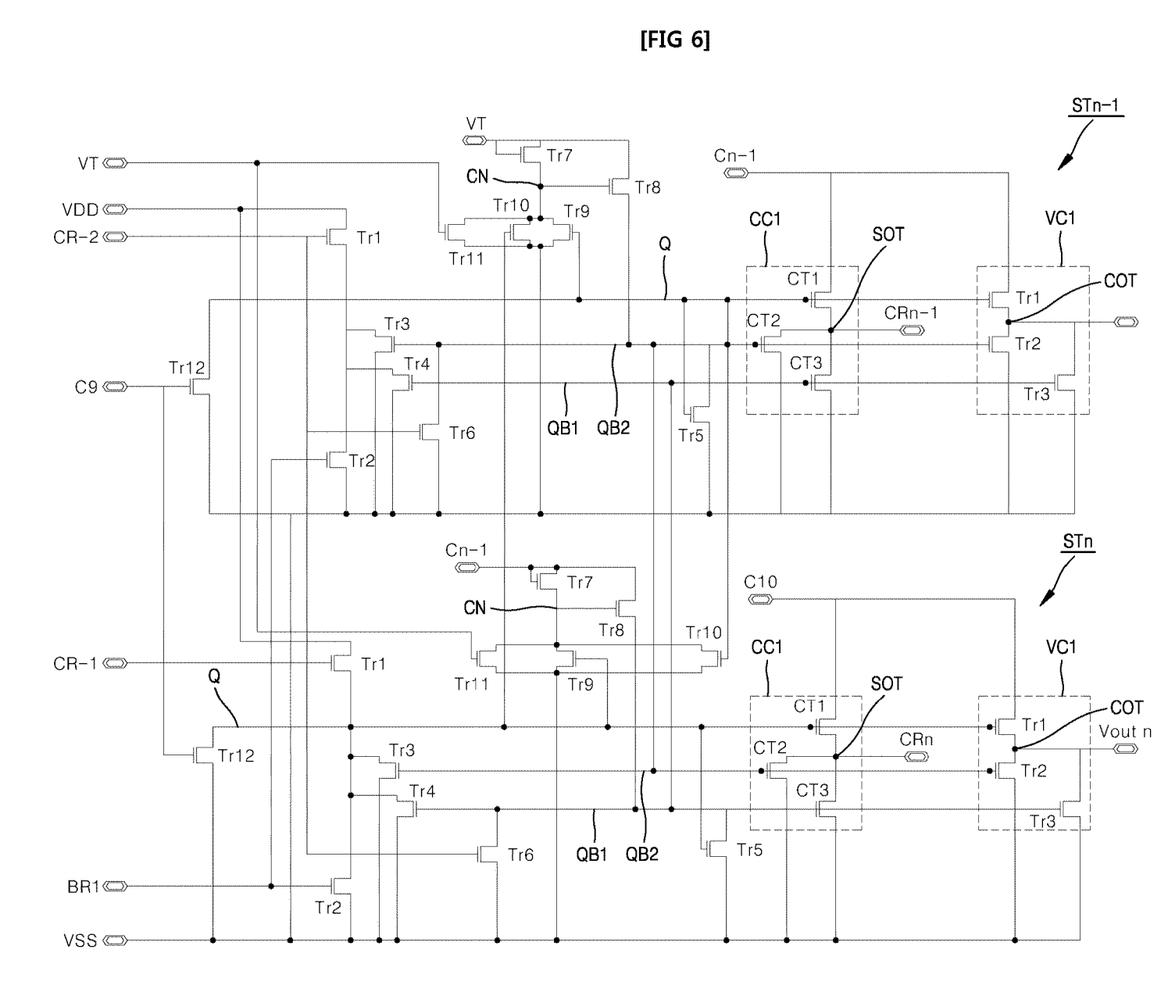
FIG. 6 is an example of a circuit diagram of the n-1th stage and the nth stage of FIG. 1.

FIG. 6 is a circuit diagram of the n−1th stage and the nth stage of FIG. 1.

Referring to FIG. 6, the n−1th stage STn−1 and the nth stage STn may be configured to share the set node Q and the first and second reset nodes QB1, QB2. As such, clock pulses having different phase differences are supplied to two adjacent stages. For example, the n−1th clock pulse is supplied to the n−1th stage, whereas the nth clock pulse is supplied to the nth stage, as shown in FIG. 1, The node controller NC of n−1th stage STn−1 includes first to twelfth switching devices Tr1 to Tr12.

The first switching device Tr1 is turned on/off by a carry pulse CR-2 from the n−2th stage STn−2. When turned on, the first switching device connects a high potential voltage source VDD to the set node Q of the n−1th stage STn−1. Instead of the high potential voltage source VDD, a carry pulse CP-2 may be supplied from the n−2th stage to a drain electrode (or a source electrode) of the first switching device Tr1 of the n−1th stage STn−1.

The second switching device Tr2 is turned on/off by at least one clock pulse or a carry pulse from one of the subsequent stages. When turned on, the second switching device Tr2 connects a low potential voltage source VSS to the set node Q of the n−1th stage STn−1.

The third switching device Tr3 is turned on/off by a voltage of the first reset node QB1. When turned on, the third switching device connects the low potential voltage source VSS to the set node Q of the n−1th stage STn−1.

The fourth switching device Tr4 is turned on/off by a voltage of the second reset node QB1. When turned on, the fourth switching device connects the low potential voltage source VSS to the set node Q of the n−1th stage STn−1.

The fifth switching device Tr5 is turned on/off by a voltage of the set node Q of the nth stage STn. When turned on, the fifth switching device connects the low potential voltage source VSS to the first reset node QB1 of the n−1th stage STn−1.

The sixth switching device Tr6 is turned on/off by a carry pulse from the n−2th stage STn−2. When turned on, the sixth switching device connects the low potential voltage source VSS to the first reset node QB1 of each of the nth stage STn and the n−1th stage STn−1.

The seventh switching device Tr7 is turned on/off by one clock signal or enable control signal. When turned on, the seventh switching device supplies one clock signal to a common node CN of the n−1th stage STn−1.

The eighth switching device Tr8 is turned on/off by a voltage of the common node CN of the n−1th stage STn−1. When turned on, the eighth switching device supplies one clock signal to the first reset node QB1.

The ninth switching device Tr9 is turned on/off by a voltage of the set node Q of the n−1th stage STn−1. When turned on, the ninth switching device connects the low potential voltage source VSS to the common node CN of the n−1th stage STn−1.

The tenth switching device Tr10 is turned on/off by a voltage of the set node Q of the nth stage STn. When turned on, the tenth switching device connects the low potential voltage source VSS to the common node CN of the n−1th stage STn−1.

The eleventh switching device Tr11 is turned on/off by a separate reset signal or one clock signal. When turned on, the eleventh switching device connects the low potential voltage source VSS to the common node CN of the n−1th stage STn−1.

The twelfth switching device Tr12 is turned on/off by a clock pulse from a previous stage. When turned on, the twelfth switching device connects the low potential voltage source VSS to the set node Q of the n−1th stage STn−1.

The node controller NC of the nth stage STn also includes first to twelfth switching devices Tr1 to Tr12.

The first switching device Tr1 is turned on/off by a carry pulse CR-1 from the n−1th stage STn−1. When turned on, the first switching device connects a high potential voltage source VDD to the set node Q of the nth stage STn. Instead of the high potential voltage source VDD, a carry pulse CP-1 from the n−1th stage may be supplied to a drain electrode (or a source electrode) of the first switching device Tr1 of the nth stage STn.

The second switching device Tr2 is turned on/off by at least one clock pulse or a carry pulse from one of the subsequent stages. When turned on, the second switching device Tr2 connects a low potential voltage source VSS to the set node Q of the nth stage STn.

The third switching device Tr3 is turned on/off by a voltage of the first reset node QB1. When turned on, the third switching device connects the low potential voltage source VSS to the set node Q of the nth stage STn.

The fourth switching device Tr4 is turned on/off by a voltage of the second reset node QB1. When turned on, the fourth switching device connects the low potential voltage source VSS to the set node Q of the nth stage STn.

The fifth switching device Tr5 is turned on/off by a voltage of the set node Q of the nth stage STn. When turned on, the fifth switching device connects the low potential voltage source VSS to the first reset node QB1 of the nth stage STn.

The sixth switching device Tr6 is turned on/off by a carry pulse from the n−1th stage STn−1. When turned on, the sixth switching device connects the low potential voltage source VSS to the first reset node QB1 of the nth stage STn.

The seventh switching device Tr7 is turned on/off by one clock signal or enable control signal. When turned on, the seventh switching device supplies one clock signal to a common node CN of the nth stage STn.

The eighth switching device Tr8 is turned on/off by a voltage of the common node CN of the nth stage STn. When turned on, the eighth switching device supplies one clock signal to the first reset node QB1.

The ninth switching device Tr9 is turned on/off by a voltage of the set node Q of the nth stage STn. When turned on, the ninth switching device connects the low potential voltage source VSS to the common node CN of the n−1th stage STn−1.

The tenth switching device Tr10 is turned on/off by a voltage of the set node Q of the n−1th stage STn−1. When turned on, the tenth switching device connects the low potential voltage source VSS to the common node CN of the nth stage STn.

The eleventh switching device Tr11 is turned on/off by a separate reset signal or one clock signal. When turned on, the eleventh switching device connects the low potential voltage source VSS to the common node CN of the nth stage STn.

The twelfth switching device Tr12 is turned on/off by a clock pulse from a previous stage. When turned on, the twelfth switching device connects the low potential voltage source VSS to the set node Q of the n−1th stage STn−1.

Figure 7:
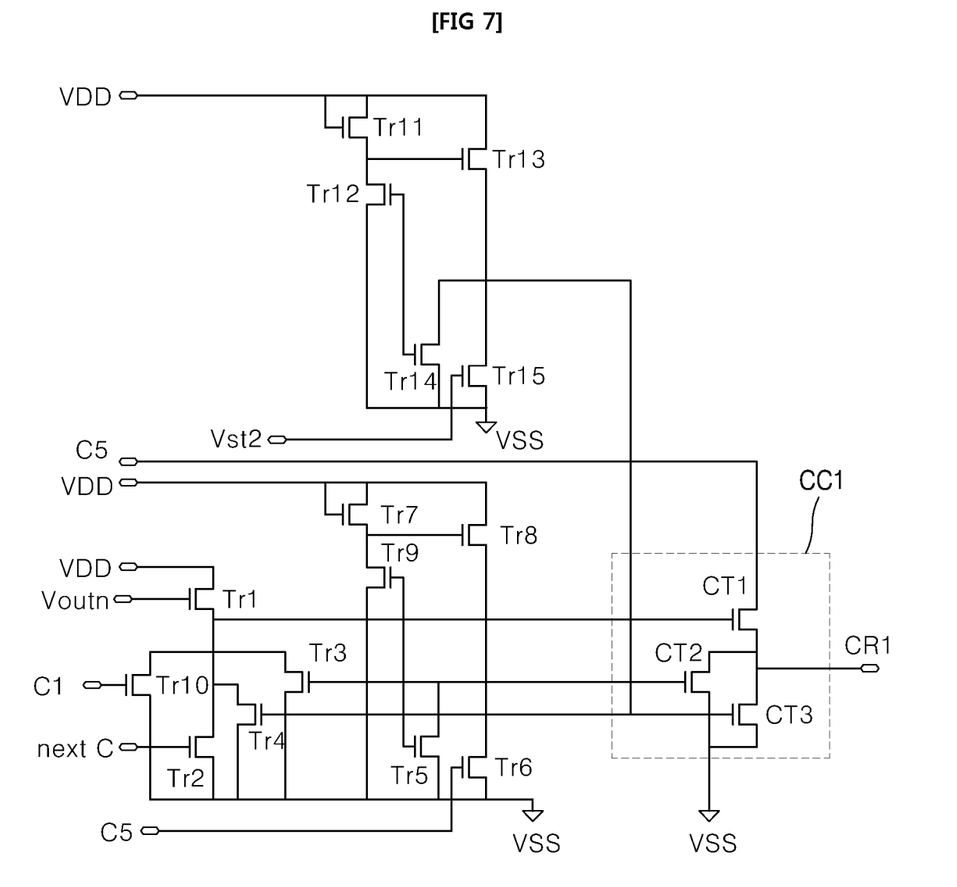
FIG. 7 is an example of a circuit diagram of the first bridge stage of FIGS. 1 and 2.

FIG. 7 is a circuit diagram of the first bridge stage of FIGS. 1 and 2.

Referring to FIG. 7, the node controller NC of the first bridge stage includes first to fifteenth switching devices Tr1 to Tr15.

The first switching device Tr1 is turned on/off by a clock pulse or start pulse from one of the preceding stages or a scan pulse Voutn from one of the preceding stages. When turned on, the first switching device connects a high potential voltage source VDD to the set node Q of the first bridge stage.

The second switching device Tr2 is turned on/off by at least one clock pulse or a clock pulse from a next stage. When turned on, the second switching device Tr2 connects a low potential voltage source VSS to the set node Q.

The third switching device Tr3 is turned on/off by a voltage of the first reset node QB1. When turned on, the third switching device connects the low potential voltage source VSS to the set node Q.

The fourth switching device Tr4 is turned on/off by a voltage of the second reset node QB1. When turned on, the fourth switching device connects the low potential voltage source VSS to the set node Q.

The fifth switching device Tr5 is turned on/off by a voltage of the set node Q. When turned on, the fifth switching device connects the low potential voltage source VSS to the first reset node QB1.

The sixth switching device Tr6 is turned on/off by one clock pulse or a carry pulse from one of the subsequent stages. When turned on, the sixth switching device connects the low potential voltage source VSS to the first reset node QB1.

The seventh switching device Tr7 is formed as a diode in the high potential voltage source VDD to be kept in a turned-on state and supplies the high potential voltage source VDD to a first common node.

The eighth switching device Tr8 is turned on/off by a voltage of the first common node. When turned on, the eighth switching device supplies the high potential voltage source VDD to the first reset node QB1.

The ninth switching device Tr9 is turned on/off by a voltage of the set node Q. When turned on, the ninth switching device connects the low potential voltage source VSS to the first common node CN.

The tenth switching device Tr10 is turned on/off by a carry pulse from a previous stage. When turned on, the tenth switching device connects the low potential voltage source VSS to the set node Q.

The eleventh switching device Tr11 is formed as a diode in the high potential voltage source VDD to be kept in a turned-on state and supplies the high potential voltage source VDD to a second common node.

The twelfth switching device Tr12 is turned on/off by a voltage of the set node of a previous stage. When turned on, the twelfth switching device connects the low potential voltage source VSS to the second common node.

The thirteenth switching device 13 is turned on/off by a voltage of the second common node. When turned on, the thirteenth switching device supplies the high potential voltage source VDD to the second reset node QB2.

The fourteenth switching device Tr14 is turned on/off by a voltage of the set node Q of a previous stage. When turned on, the fourteenth switching device connects the low potential voltage source VSS to the second reset node QB2.

The fifteenth switching device Tr15 is turned on/off by one start pulse or clock pulse of a previous stage. When turned on, the fifteenth switching device connects the low potential voltage source VSS to the second reset node QB2.

In the shift register according to the present invention, the stages of the shift register can be driven in association with one another even during the touch sensing period, thereby preventing deterioration of specific stages. That is, the plurality of bridge stages is disposed between each pair of adjacent stages among a plurality of stages divided according to an image display period and a touch sensing period to allow the plurality of stages to be driven in association with one another even during the touch sensing period, thereby preventing deterioration of specific stages.

Figure 8:
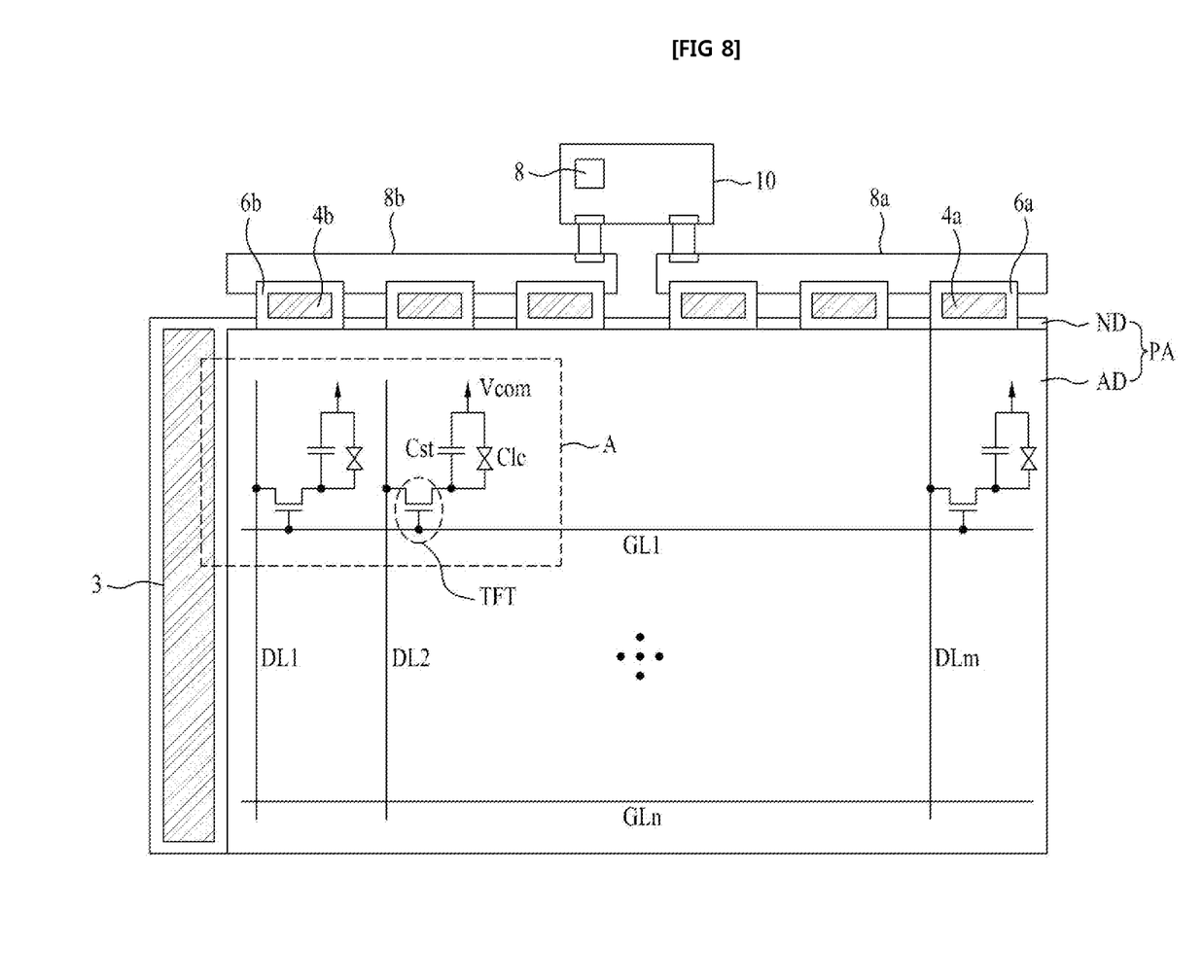
FIG. 8 is a block diagram of an image display including the shift register according to an example of the present invention.

FIG. 8 is a block diagram of an image display including the shift register according to an example of the present invention.

Although the image display is shown as a liquid crystal display in FIG. 8, it should be understood that the present invention is not limited thereto and the image display may include organic light emitting diode displays, field emission displays, and the like.

Referring to FIG. 8, the liquid crystal display including the shift register according to the present invention includes a liquid crystal panel PA including a plurality of liquid crystal cells arranged in an image display area AD to display an image; a gate driver 3 driving a plurality of gate lines GL1 to GLn arranged in parallel in the image display area AD; a plurality of data drivers 4a, 4b driving a plurality of data lines DL1 to DLm; and a timing controller 8 controlling the gate driver 3 and the data drivers 4a, 4b.

The liquid crystal panel PA is composed of the image display area AD and an image non-display area ND. The image display area AD has the plurality of liquid crystal cells arranged therein to display an image, whereas the image non-display area ND has data circuit films 6a, 6b attached thereto or has the gate driver 3 disposed therein.

Specifically, in the image display area AD, the liquid crystal cells are formed in a matrix area defined by the plurality of gate lines GL1 to GLn and the plurality of data lines DL1 to DLm. Here, each of pixel cells includes a thin film transistor (TFT) and a liquid crystal capacitor Clc connected to the TFT. The liquid crystal capacitor Clc is composed of a pixel electrode connected to the TFT and a common electrode facing the pixel electrode with a liquid crystal therebetween. The TFT supplies an image signal from each of the data lines DL1 to DLm to the pixel electrode in response to a scan pulse from each of the gate lines GL1 to GLn. The liquid crystal capacitor Clc is charged with a voltage difference between the image signal supplied to the pixel electrode and a common voltage supplied to the common electrode, and changes the arrangement of liquid crystal molecules based on the voltage difference to adjust light transmittance, thereby realizing gradation.

The data drivers 4a, 4b are disposed between both sides of the liquid crystal panel PA and at least one of the source printed circuit boards 8a, 8b, respectively, and include an integrated circuit to drive the data lines DL1 to DLm. In addition, each of the data drivers 4a, 4b converts image data supplied from the timing controller 8 into an analog voltage, that is, an image signal using a data control signal from the timing controller 8 and outputs the image signal.

The gate driver 3 includes the shift register according to the present invention, which is described above with reference to FIGS. 1 to 7, to sequentially supply scan pulses or gate low voltages to the gate lines GL1 to GLn. The shift register is formed integrally with the liquid crystal panel PA in the image non-display area ND of the liquid crystal panel PA, and is operated by input of a gate control signal from the timing controller 8, for example, first and second start pulses Vst1, Vst2, a high potential voltage source VDD at at least one level, and a low potential voltage source VSS at a different level. The gate driver includes the shift register according to the embodiment of the invention to sequentially supply a plurality of scan pulses to a plurality of gate lines corresponding to a plurality of block regions divided according to an image display period and a touch sensing period alternated plural times during each frame period. Since the shift register has already been described with reference to FIGS. 1 to 7, detailed description thereof will be omitted.

As described above, the shift register according to the embodiments of the present invention includes a plurality of bridge stages between each pair of adjacent stages among a plurality of stages divided according to an image display period and a touch sensing period to allow the plurality of stages to be driven in association with one another even during the touch sensing period, thereby preventing deterioration of specific stages. Particularly, the shift register according to the embodiments of the present invention can prevent an abnormal screen such as a horizontal line defect in an image display panel, reduce a defect rate, and enhance customer satisfaction, thereby improving product reliability.

Although some embodiments have been described herein, it should be understood that these embodiments are provided for illustration only and are not to be construed in any way as limiting the present invention, and that various modifications, changes, alterations, and equivalent embodiments can be made by those skilled in the art without departing from the spirit and scope of the invention. The scope of the present invention should be defined by the appended claims and equivalents thereof.

What is claimed is:

1. A shift register having a plurality of stages dependently connected to one another, the shift register comprising:
   first to $n^{th}$ stages dependently connected to one another in each of a plurality of block regions divided according to an image display period and a touch sensing period alternating plural times during each frame period, where n is a positive integer equal to or greater than 2; and
   first and second bridge stages disposed between each pair of adjacent block regions,
   wherein, during the plurality of image display periods in each frame period, the first to $n^{th}$ stages in each block region sequentially output one carry pulse and one scan pulse, and
   during the plurality of touch sensing periods in each frame period, the first bridge stage next to the $n^{th}$ stage receives an $n^{th}$ carry pulse from the $n^{th}$ stage and outputs a first bridge pulse to the $n^{th}$ stage to force the $n^{th}$ stage to be disabled, and
   wherein, during the plurality of image display periods in each frame period, the second bridge stage supplies a second bridge pulse to a first stage in a next block region to force the first to $n^{th}$ stages in the next block region to sequentially output one carry pulse and one scan pulse.

2. The shift register according to claim 1, wherein each of the first to $n^{th}$ stages comprises:
   a node controller;

a carry output unit connected to a set node and first and second reset nodes of the node controller and configured to output a carry pulse; and a scan pulse output unit connected to the set node and the first and second reset nodes and configured to output a scan pulse.

3. The shift register according to claim 1, wherein the first bridge stage comprises:

a node controller configured to control a set or reset state of a set node and first and second reset nodes according to a carry pulse from the $n^{th}$ stage preceding the first bridge stage; and a carry output unit connected to the set node and the first and second reset nodes of the node controller, and configured to supply the first bridge pulse to the $n^{th}$ stage according to the state of the set node and the first and second reset nodes.

4. The shift register according to claim 1, wherein the second bridge stage comprises:

a node controller configured to control a set or reset state of a set node and first and second reset nodes according to at least one clock pulse or at least one start pulse; and a carry output unit connected to the set node and the first and second reset nodes of the node controller, and configured to generate the second bridge pulse and supply the second bridge pulse to the first stage in the next block region.

5. An image display, comprising:

an image display panel having an image display area to display an image;

a gate driver configured to drive a plurality of gate lines arranged in parallel in the image display area;

a plurality of data drivers configured to drive a plurality of data lines; and a timing controller configured to drive timings of the gate driver and the data drivers, wherein the gate driver comprises the shift register according to claim 1 in order to sequentially supply a plurality of scan pulses to the plurality of gate lines corresponding to a plurality of block regions divided according to an image display period and a touch sensing period alternating plural times during each frame period.

6. A method of driving a shift register having a plurality of stages dependently connected to one another, the method comprising:

sequentially driving first to $n^{th}$ stages dependently connected to one another in each of block regions divided according to an image display period and a touch sensing period alternating plural times during each frame period, where n is a positive integer equal to or greater than 2;

driving a first bridge stage disposed between each pair of adjacent block regions; and driving a second bridge stage disposed between each pair of adjacent block regions, wherein, during the plurality of image display periods in each frame period, the first to $n^{th}$ stages in each block region sequentially output one carry pulse and one scan pulse, and during the plurality of touch sensing periods in each frame period, the first bridge stage next to the $n^{th}$ stage receives an $n^{th}$ carry pulse from the $n^{th}$ stage and outputs a first bridge pulse to the $n^{th}$ stage to force the $n^{th}$ stage to be disabled, and wherein, during the plurality of image display periods in each frame period, the second bridge stage supplies a second bridge pulse to a first stage in a next block region to force the first to $n^{th}$ stages in the next block region to sequentially output one carry pulse and one scan pulse.

7. The method according to claim 6, wherein the sequentially driving each of the first to $n^{th}$ stages comprises:

controlling a set node and first and second reset nodes of a node controller;

outputting, by a carry output unit, a carry pulse according to a control state of the set node and the first and second reset nodes, the carry output unit being connected to the set node and the first and second reset nodes of the node controller; and outputting, by a scan pulse output unit, a scan pulse according to a control state of the set node and the first and second reset nodes, the scan pulse output unit being connected to the set node and the first and second reset nodes of the node controller.

8. The method according to claim 6, wherein the driving the first bridge stage comprises:

a node control step in which a set or reset state of a set node and first and second reset nodes is controlled according to a carry pulse from the $n^{th}$ stage preceding the first bridge stage; and a carry output step in which a carry output unit connected to the set node and the first and second reset nodes supplies the first bridge pulse to the $n^{th}$ stage according to the state of the set node and the first and second reset nodes.

9. The method according to claim 6, wherein the driving the second bridge stage comprises:

a node control step in which the set or reset state of a set node and first and second reset nodes is controlled according to at least one clock pulse or at least one start pulse; and a carry output step in which a carry output unit connected to the set node and the first and second reset nodes generates the second bridge pulse according to the state of the set node and the first and second reset nodes and supplies the second bridge pulse to a first stage in a next block region.

10. A shift register comprising:

a first block region including a first group of first to $n^{th}$ stages dependently connected to one another, where n is a positive integer equal to or greater than 2;

a second block region including a second group of first to $m^{th}$ stages dependently connected to one another, where m is a positive integer equal to or greater than 2;

a third block region including a third group of first to $x^{th}$ stages dependently connected to one another, where x is a positive integer equal to or greater than 2;

a first pair of first and second bridge stages disposed between the first block region and the second block region; and a second pair of first and second bridge stages disposed between the second block region and the third block region, wherein the first to $n^{th}$ stages dependently connected to one another in each of the first, second and third block regions are divided according to an image display period and a touch sensing period, wherein the image display period and the touch sensing period alternate multiple times during each frame period, wherein the first bridge stage among the first pair of first and second bridge stages is configured to output a first bridge pulse to the $n^{th}$ stage in the first block region to force the $n^{th}$ stage in the first block region to be disabled during the touch sensing period, and wherein, during the image display period, the second bridge stage among the first pair of first and second bridge stages supplies a second bridge pulse to a first stage in a next block region to force the first to $n^{th}$ stages in the next block region to sequentially output one carry pulse and one scan pulse.

11. The shift register according to claim 10, wherein a voltage of an $n^{th}$ gate line corresponding to the $n^{th}$ stage in the first block region maintains a low level during the touch sensing period based on the first bridge pulse.

12. The shift register according to claim 10, wherein the second group of first to $n^{th}$ stages of the second block region are disposed between the first and second pairs of first and second bridge stages.

\* \* \* \* \*